(12) United States Patent
Winick et al.

(10) Patent No.: US 6,600,239 B2
(45) Date of Patent: *Jul. 29, 2003

(54) ACTIVE CIRCUIT PROTECTION FOR SWITCHED POWER SUPPLY SYSTEM

(75) Inventors: Bradley D. Winick, Fort Collins, CO (US); Robert B. Smith, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 122 days.

This patent is subject to a terminal disclaimer.

(21) Appl. No.: 09/814,525

(22) Filed: Mar. 22, 2001

(65) Prior Publication Data

US 2002/0135235 A1 Sep. 26, 2002

(51) Int. Cl.[7] .................................................. H02J 9/00
(52) U.S. Cl. ................................. 307/85; 307/87
(58) Field of Search ........................ 307/85–87, 65, 307/70

(56) References Cited

U.S. PATENT DOCUMENTS

| 4,492,876 A | * | 1/1985 | Colbert et al. | ............ 307/66 |
|---|---|---|---|---|
| 4,788,450 A | * | 11/1988 | Wagner | ................ 307/64 |
| 4,812,672 A | * | 3/1989 | Cowan et al. | ............ 307/43 |
| 5,598,041 A | * | 1/1997 | Willis | ........................ 307/43 |
| 5,654,859 A | * | 8/1997 | Shi | ............................ 361/100 |
| 5,672,958 A | * | 9/1997 | Brown et al. | ............ 307/53 |
| 5,686,814 A | * | 11/1997 | Wierzbicki | .............. 307/51 |
| 5,739,596 A | * | 4/1998 | Takizawa et al. | ...... 307/64 |
| 5,796,274 A | * | 8/1998 | Willis et al. | .............. 307/44 |
| 5,945,816 A | * | 8/1999 | Marusik | ................ 307/86 |
| 6,420,906 B1 | * | 7/2002 | Kohda | .................. 326/113 |
| 6,462,434 B1 | * | 10/2002 | Winick et al. | ............ 307/85 |

FOREIGN PATENT DOCUMENTS

CA      2032662      * 10/1991      ............ H02J/1/10

* cited by examiner

*Primary Examiner*—Fritz Fleming

(57) ABSTRACT

An active protection circuit for a MOSFET isolated switched power supply system operates to control the switching of the MOSFET isolation switches. A monitoring circuit operates to sense and turn off the isolation switch of the currently active power supply if it senses reverse current flowing through the switch. Simultaneously, a controller receives indication that the active power supply is out of specification, and actively switches the system voltage source to the other power supply. The controller actively ensures that the isolation switch of the out-of-specification power supply remains off until it determines otherwise.

2 Claims, 3 Drawing Sheets

ACTIVE CIRCUIT PROTECTION FOR SWITCHED POWER SUPPLY SYSTEM

FIELD OF THE INVENTION

The present invention pertains generally to switched power supplies connected in parallel to a common load, and more particularly to protection logic that protects the switching circuitry and prevents the currently active power supply of a switched power supply system from either reaching a current limit condition or causing a large voltage deviation at the load.

BACKGROUND OF THE INVENTION

In many electronic circuit applications, multiple power supplies are connected in parallel to drive a common load during different times of operation. One application example is a device that implements a standby or "sleep" mode. During standby mode such a device might use a low power DC supply such as a battery or DC—DC converter to power the minimal circuitry required to "awaken" the device, and upon awakening switch to a higher power DC supply that supports the current requirements of the functional circuitry.

In switched power supply systems, switching devices are used to switch different power supplies to actively provide power to a common load. These switching devices are controlled using dedicated control logic that only allows one voltage source to supply power to the common load. In many applications, the load is sensitive to large voltage deviations. Accordingly, it is important to limit the voltage deviation seen at the load even when the source of power is being switched from one power supply to another.

In voltage deviation sensitive loads, the implementation choice of the switching devices becomes important. Switching relays switch too slowly to meet strict voltage deviation limitation requirements when used alone. The switching performance can be improved with the use of very large capacitors; however, this increase the expense and size of the overall system.

Analog switches are also a poor choice for voltage deviation sensitive loads. Analog switches are characterized by a high internal resistance, which can create a voltage drop at the load greater than the allowed voltage deviation during normal operation.

Recently, N-Channel MOSFETs are being used to switch between multiple different power supplies to actively power a common load. In such a switching arrangement, the MOSFETs are connected with their drains tied together at the load and their respective sources connected to the output of their respective power supplies.

As termed herein, when a MOSFET switch associated with a particular power supply is turned OFF to isolate its respective power supply from the load, the respective power supply is referred to as an "isolated power supply". When the MOSFET switch is turned ON to connect its respective power supply to the load, the respective power supply is referred to herein as an "active power supply". As will be appreciated by those skilled in the art, in a switched power supply system, all power supplies switchably connected to the load may remain powered ON; accordingly, although an isolated power supply is isolated from the load, it may still supply power at its output.

Due to its construction, an N-Channel MOSFET is characterized by an intrinsic body diode across the source and drain. In particular, the anode of the intrinsic body diode is connected at the source node and the cathode is connected at the drain node. In the MOSFET arrangement just described, wherein the drains of each switching MOSFET are tied together, the cathodes of the intrinsic body diodes in the MOSFETs are tied together. This design configuration creates the appearance of using OR-ing diodes. The voltage source outputs must be within a diode drop (approximately 0.6 volts) of each other because if the output voltage of an isolated power supply is greater than a diode drop of an active power supply, it will forward bias the intrinsic body diode in the isolated power supply's associated MOSFET switch and will also supply power to the load. Accordingly, unless the output voltages of each of the power supplies are within a diode drop of each other, their associated MOSFET switches will not provide isolation even if one MOSFET switch is on and the others are off. In particular, the power supply with an output voltage greater than a diode drop of another power supply will source current to the load even though its MOSFET switch is turned off by the forward bias created by the voltage differential across the intrinsic body diode of its switch.

Even if the output voltages of each switched power supply are within a diode drop of one another, a failure in the active power supply will cause a forward bias of the intrinsic body diode of the isolation switch of the isolated power supply, causing the isolated power supply to supply power directly into the failed power supply. The active power supply may then go into current limit. If the active power supply is allowed to continue to operate in current limit, it may eventually damage the MOSFET switch of the isolated power supply due to excessive power dissipation in its intrinsic body diode.

A need therefore exists for protecting the MOSFET isolation switches in a MOSFET switched power supply system when a failure occurs in one of the power supplies. A need also exists for protecting the remaining non-faulty power supplies to ensure that the remaining power supplies, and therefore the load, remains within specified tolerance limits.

SUMMARY OF THE INVENTION

The present invention solves the problems of the prior art by preventing the active power supply of a switched power supply system from either reaching a current limit condition or causing a large voltage deviation at its output and at the load. The invention protects the switching circuit components from being damaged. The invention also ensures that the system will continue to run without interruption even if a failure occurs in the active power supply that is currently supplying power to the load.

In accordance with the invention, an active protection circuit operates to control the switching of the MOSFET isolation switches. A monitoring circuit operates to sense and turn off the isolation switch of the currently active power supply if it senses reverse current flowing through the switch. Simultaneously, a controller receives indication that the active power supply is out of specification, and actively switches the system voltage source to the other power supply. The controller actively ensures that the isolation switch of the faulty power supply remains off until it determines otherwise.

BRIEF DESCRIPTION OF THE DRAWINGS

The invention will be better understood from a reading of the following detailed description taken in conjunction with the drawing in which like reference designators are used to designate like elements, and in which.

DETAILED DESCRIPTION OF THE INVENTION

Figure 1:
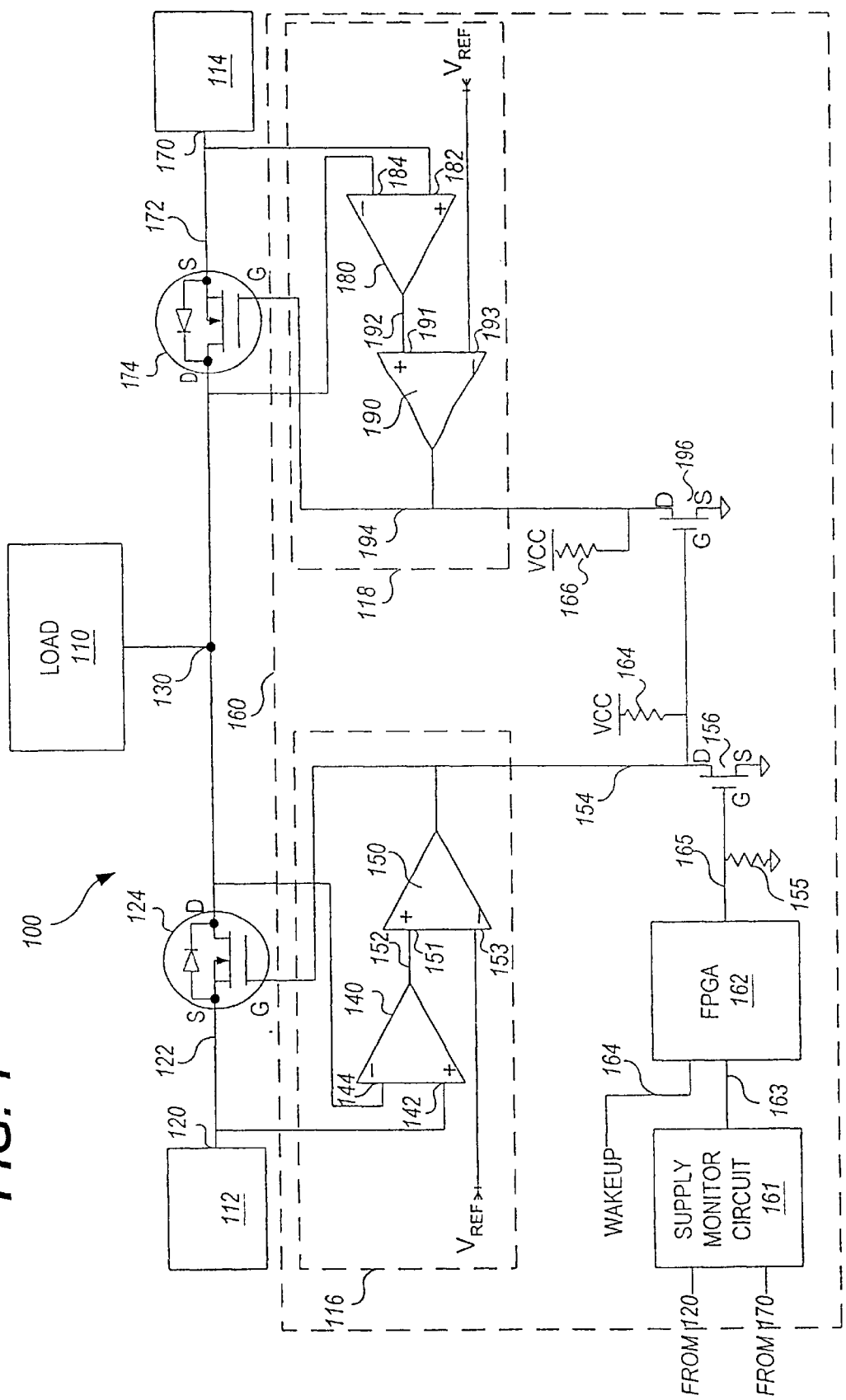
FIG. 1 is schematic block diagram of a switched power supply system incorporating an active protection circuit in accordance with the invention.

FIG. 1 is a schematic block diagram of a dual power supply system 100 comprising switching control logic implemented in accordance with the invention. System 100 includes a first and second power supply 112 and 114 operatively connected in parallel to a common load 110 comprising electronic components. First power supply 112 supplies power at an output 120; similarly second power supply 114 supplies power at an output 170. A pair of isolation switches 124 and 174 are operatively connected between respective power supplies 112 and 114, both with outputs connected to the common load 110 at node 130. As described in greater detail below, the outputs of the first power supply 112 and the second power supply 114 are operatively connected together in parallel, yet may be isolated from each other by operation of isolation switches 124 and 174.

In particular, the first isolation switch 124 (sometimes referred to as the first isolation MOSFET) has an input (source S) connected to the output 120 of first power supply 112, an output (drain D) connected to the common load 110 at node 130, and a control (gate G) which allows or disallows operative connection of the first power supply 112 to node 130. Similarly, the second isolation switch 174 (sometimes referred to the second isolation MOSFET) has an input (source S) connected to the output 170 of second power supply 114, an output (drain D) connected to the common load 110 at node 130, and a control (gate G) which allows or disallows operative connection of the second power supply 114 to node 130.

In the preferred embodiment, first and second isolation switches 124, 174 are each implemented with an N-channel MOSFET which exhibits an intrinsic body diode. By connecting the drains of the first and second isolation MOSFETs 124, 174, the intrinsic diode in each MOSFET gives the functionality of a diode OR-ing arrangement to provide isolation to the outputs, as described in detail hereinafter. In particular, the source S of the first isolation MOSFET 124 is electrically connected to the output 120 of first power supply 112, and its drain D is connected to the load at node 130. The drain-to-source current IDS in the first isolation MOSFET 124 is switchable between an ON mode and an OFF mode by application of a bias voltage on the gate. When in the ON mode, current flows from the source to the drain, and a voltage corresponding to the current flow is generated between the source S and drain D. As will be described in greater detail below, this voltage is used to determine the current flow, including the direction of current flow, through the first isolation MOSFET 124. As described in the background section, an N-channel MOSFET has an intrinsic body diode acting between the source and the drain wherein the anode of the diode is connected to the source and the cathode is connected to the drain. The intrinsic body diode of the first isolation MOSFET 124 serves to isolate the first power supply 112 from node 130 when the voltage at output 120 is less than a diode drop greater than the voltage present on node 130.

The operation of the second isolation switch 174 is similar to that of the first isolation switch 124, but isolates the second power supply 114 from node 130 when the voltage at output 170 is less than a diode drop greater than the voltage present on node 130.

A first monitoring circuit 116 is operatively connected between the input S and output D of the first isolation switch 124 to provide control of the first isolation switch 124, and therefore the operative connection of the first power supply 112 to node 130.

The first monitoring circuit 116 includes a first differential amplifier 140 and first voltage comparator 150. The non-inverting input 142 of the first differential amplifier 140 is electrically connected to the source S of the first isolation MOSFET 124 and the inverting input 144 is electrically connected to the drain D of the first isolation MOSFET 124. It should be noted that other components, not shown in FIG. 1, may be associated with the first differential amplifier 140. The first differential amplifier 140 serves to measure the voltage drop between the source S and drain D of the first isolation MOSFET 124. It is to be understood that the use of a differential amplifier to measure a voltage is for illustration purposes only and that other voltage measuring devices may be used to measure the voltage drop between the source and drain of the first isolation MOSFET 124. The output of the first differential amplifier 140 is electrically connected to the non-inverting input 151 of a first voltage comparator 150 by way of a line 152. A preselected voltage $V_{REF}$ is input to the inverting input 153 of the first voltage comparator 150. The first voltage comparator 150 compares the output of the first differential amplifier 140 to the preselected voltage $V_{REF}$. The output of the first voltage comparator 150 is electrically connected to the gate of the first isolation MOSFET 124 by way of a line 154. It should be noted that other electronic components, not shown in FIG. 1, may be associated with the first voltage comparator 150.

Describing now the connections to the second power supply 114, a second monitoring circuit 118 is operatively connected between the input S and output D of the second isolation switch 174 to provide control of the second isolation switch 174, and therefore the operative connection of the second power supply 114 to node 130.

The second monitoring circuit 118 includes a second differential amplifier 180 and second voltage comparator 190. The non-inverting input 182 of the second differential amplifier 180 is electrically connected to the source S of the second isolation MOSFET 174 and the inverting input 184 is electrically connected to the drain D of the second isolation MOSFET 174. The second differential amplifier 180 serves to measure the voltage drop between the source and drain of second isolation MOSFET 174. It is to be understood that the use of the second differential amplifier 180 is for illustration purposes only and that other voltage measuring devices may be used to measure the voltage drop between the source and drain of the second isolation MOSFET 174. It is also to be understood that other components, not shown, may be associated with the second differential amplifier 180. The output of the second differential amplifier 180 is electrically connected to the non-inverting input 191 of a second voltage comparator 190 by way of a line 192. The preselected voltage $V_{REF}$ is input to the inverting input 193 of the second voltage comparator 190. The second voltage comparator 190 compares the output of the second differential amplifier 180 to the preselected voltage $V_{REF}$. The output of the first voltage comparator 190 is electrically connected to the gate of the second isolation MOSFET 174 by way of a line 194. It is to be understood that other electronic components, not shown in FIG. 1, may be associated with the second voltage comparator 190.

In a switched power supply system, it is typically desired that in normal operation only one or the other of the power supplies 112, 114 supply power to the load at any given time. For example, suppose that the load 110 is a device that includes a standby or "sleep" mode that utilizes a low power battery or DC—DC converter as the first power supply 112 to supply +3.3 volts to the circuitry (in the load 110 but not shown) that monitors when to wake up the device and that performs the wakeup functions. In this example, one of the functions performed by the wakeup function is to switch the active power source from the low-power first power supply 112 to a high-power second power supply 114 in order to meet the power requirements of the fully functioning load 110. Accordingly, during proper normal operation, it is desirable that only one or the other of the power supplies 112, 114 supply power to the load 110 at any given time. However, if a fault occurs in the currently active power supply, then the active protection circuit of the invention, described hereinafter, will switch the current active supply from the faulty power supply to the remaining good power supply.

Figure 2:
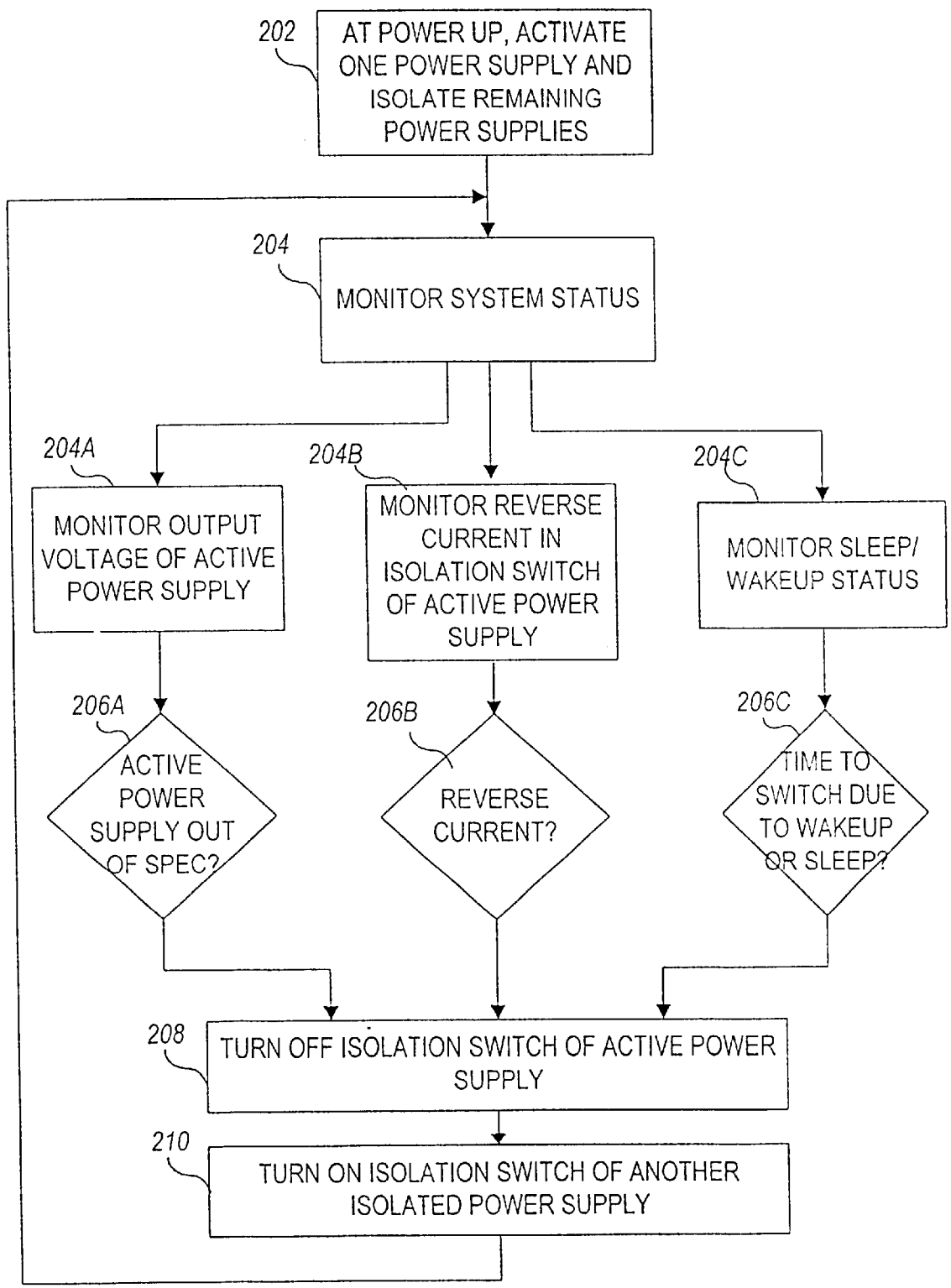
FIG. 2 is an operational flowchart of an exemplary embodiment of the method of the invention.

FIG. 2 is a flow diagram illustrating an exemplary embodiment of the method of the invention. As illustrated, at power up, as shown in step 202, one of the power supplies is operatively connected to the load to actively supply power to the load 110, and the other power supplies are isolated from the load or off. The system status is then monitored 204, including monitoring the output voltage of the activated power supply (step 204A), monitoring the reverse current in the isolation switch of the active power supply (step 204B), and monitoring other system status such as the system mode (sleep vs. wakeup) (step 204C). If a status change is detected in the system mode (for example, the system is to wake up), as detected in step 206C, the currently active power supply is isolated from the load by turning OFF 208 the isolation switch of the active power supply, and one of the remaining good power supplies is operatively connected to the load to actively supply power to the load by turning ON 210 the isolation switch of a selected remaining good power supply.

If a failure occurs in the output voltage of the active power supply, as detected at step (206A), or if reverse current is sensed in the isolation switch 174 of the active power supply 114, as detected at step (206B), the isolation switch of the active power supply is turned OFF to block reverse current from flowing to the active power supply, and the isolation switch of a selected remaining good power supply is turned ON to allow the selected power supply to actively supply power to the load.

Turning back to FIG. 1, the active protection circuit of the invention, shown at 160, will now be described in detail. In particular, in the illustrative embodiment, the active protection circuit 160 connects to the control lines 154 and 194 and hence to the gates G of first and second isolation MOSFETs 124 and 174. In the illustrative embodiment, active protection circuit 160 comprises a controller 162 implemented as a state machine (not shown) in a Field Programmable Gate Array (FPGA). A power supply monitoring circuit 161 monitors the voltages at outputs 120 and 170 and outputs status signal(s) 163 indicating whether one or the other of the voltages at the outputs 120, 170 of the power supplies 112, 114 fall out of specification. In the preferred embodiment, specification means +3.3 volts plus or minus a preselected tolerance amount. The controller 162 receives the status signals 163. Controller 162 may also receive other system state information signals such as a wakeup signal 164 which may be used to determine when to switch power supply sources during normal operation. It should be noted that other system status signals, not shown in FIG. 1, may be input to the controller 162 for use thereby to control the isolation switches 124, 174.

In the illustrative embodiment, controller 162 generates an output signal on line 165, which is used to control a first control switching device 156. The first control switching device 156 has an input (source S) connected to a low voltage source (e.g., ground), an output (drain D) connected to the output of the comparator 150 and control input G of first isolation MOSFET 124, and a control (gate G) controlled by controller 162 on line 165. As described in detail hereinafter, the first control switching device 156 provides a mechanism for the controller 162 to turn the isolation switches 124, 174 ON or OFF from the controller 162.

Active protection circuit 160 may further comprise a second control switching device 196. Second control switching device 196 has its source S connected to a low voltage source (e.g., ground), and its drain D connected to line 194 (and therefore the gate G of second isolation MOSFET 174). The gate G of second control switching device 196 is connected to the drain D of first control switching device 156, which is in turn controlled by the controller 162 on line 165. The first control switching device 156 and second control switching device 196 control first and second isolation MOSFETs 124 and 174, such that both switching isolation MOSFETs 124, 174 will not be turned ON at the same time.

In discussing the operation of the active protection circuit, the following assumptions are made: (1) at system startup both power supplies 112, 114 are initially powered on, (2) during normal operation only one power supply 112, 114 actively supplies power to the load at a time, and (3) at startup the system is first placed in a standby mode which uses the first power supply 112 and later switches to using the second power supply 114 when full functionality is required. In operation, at system startup, controller 162 outputs a low voltage on line 165. During the initial moments of the power up process, pull-down resistor 155 ensures that the line 165 will be pulled low. Accordingly, the first control switching device 156 is turned OFF, which isolates line 154 from the source S (ground) of first control switching device 154. Line 154 is pulled high by pull-up resistor 164, which turns ON the first isolation MOSFET 124. Also at system startup, the second control switching device 196 is turned ON since line 154 is pulled to $V_{cc}$ by pull-up resistor 164, thereby pulling line 194 low and ensuring that the second MOSFET isolation switch 174 is turned OFF.

Accordingly, at system startup, the first power supply 112 actively supplies power to the load 110, while the second power supply 114 is isolated from the load. During this state, the source of the first isolation MOSFET 124 will have a voltage of +3.3 volts, which will be present on the non-inverting input 142 to the first differential amplifier 140. The voltage at the source S is slightly higher than the voltage at the drain D, meaning that current is flowing from the first power supply 112 to the load 110. Accordingly, approximately +3.3 volts will be present on the non-inverting input 142 of the differential amplifier 140 and a slightly lower voltage will be present on the inverting input 144 of the differential amplifier 140. The gain of the first differential amplifier 140 is preselected so that it is able to measure the small voltage difference between the source S and the drain D of the first isolation MOSFET 124. The gain of the first differential amplifier 140 is also high enough to cause the output of the first differential amplifier 140 to be greater than the voltage $V_{REF}$ when a slight voltage difference between the source S and the drain D of the first isolation MOSFET 124 is measured. Accordingly, the first voltage comparator 150 will maintain a high voltage on line 154 and therefore at the gate G of the first isolation MOSFET 124, which keeps the first isolation MOSFET 124 ON.

During the time that the first power supply 112 actively supplies power to the system, second power supply 114 is isolated from the load. However, because the second power supply 114 is powered on, approximately +3.3 volts will be present on the non-inverting input 182 of the differential amplifier 180. As discussed above, a slightly lower voltage will be present on node 130 as supplied by the first power supply 112 and this slightly lower voltage will be present on the inverting input 184 of the differential amplifier 180. As a result, the second differential amplifier 180 will output a high voltage on line 192. The high voltage output by the differential amplifier 180 is compared to the positive reference voltage $V_{REF}$ by second voltage comparator 190, which causes a high voltage output onto line 194. However, because second control switching device 196 is in the ON state, the line 194 is pulled to a low voltage. The low voltage on line 194 is present on the gate G of second isolation switch 174, ensuring that it remains in the OFF state and that the second power supply 114 is isolated from the load 110. The intrinsic body diode of the second isolation MOSFET 174 blocks current from the first power supply 112 from flowing into the second power supply 114, to provide isolation.

When, for whatever reason (e.g., the device is switching out of a standby mode into a full functionality mode), the source of power is to be switched from the first power supply 112 to the second power supply 114, the controller 162 places a high voltage on line 165, which is present at the gate G of first control switching device 156. Accordingly, the first control switching device 156 is turned ON, allowing current to flow therethrough. Since the source S is at a low voltage level (e.g., ground), line 154 is pulled low, turning OFF the first isolation MOSFET 124.

When line 154 is pulled low by turning on first control switching device 156, the low voltage is present at the gate G of second control switching device 196, causing the device 196 to turn OFF. Pull-up resistor 166 pulls line 194 high, which turns ON the second isolation MOSFET 174 to allow the second power supply 114 to actively supply power to the load 110.

When the second isolation MOSFET 174 is ON, the voltage at the source S will be slightly higher than the voltage at the drain D if current is flowing from the second power supply 114. The gain of the second differential amplifier 180 is preselected so that it is able to measure the small voltage difference between the source and the drain of the second isolation MOSFET 174. The gain of the second differential amplifier 180 is also high enough to cause the output of the second differential amplifier 180 to be greater than the voltage $V_{REF}$ when the slight voltage difference between the source and the drain of the second isolation MOSFET 174 is measured. Accordingly, the second voltage comparator 190 outputs a high voltage to the gate of the second isolation MOSFET 174, which keeps the second isolation MOSFET 174 ON whenever the second power supply 114 is selected as the active power supply by the controller (by turning the second control switching device 196 OFF).

Due in part to the low output resistances of conventional power supplies, when one power supply fails in a switched power supply system, its output voltage can drop below specification, causing it to sink current from the remaining power supplies. If during normal operation a fault occurs in the second power supply 114 such that the voltage at the source S of second isolation MOSFET 174 drops low enough that the first power supply 112 starts to source current into the second power supply 114, the voltage at the drain D of the second isolation MOSFET 174 will be greater than the voltage at the source S of the second isolation MOSFET 174. Accordingly, current from first power supply 112 will flow through the intrinsic body diode of first isolation MOSFET 124, through second isolation MOSFET 174 and into the second power supply 114. The voltage at the source S of the second isolation MOSFET 174 will fall below the voltage at the drain D and the differential amplifier 180 will detect the negative difference and output a low voltage level on line 192. The low voltage level output on line 192 will be below the reference voltage $V_{REF}$, which will cause the second voltage comparator 190 to output a low voltage level on line 194, thereby turning OFF the second isolation switch 174. When the isolation switch 174 is off, the intrinsic body diode blocks reverse current from flowing through the switch to the failed second power supply 114. This will protect the remaining first power supply 112 from going into current limit and prevent a large enough voltage deviation at its output 120 that could cause a failure in the load 110.

However, at the time power supply 114 failed, first isolation MOSFET 124 was still OFF. If first isolation MOSFET 124 is allowed to remain OFF after the second isolation MOSFET 174 has been turned OFF in response to a failure in the second power supply 114, all the current in the load 110 will be sourced by the first power supply 112 and will flow through the intrinsic body diode of the first isolation MOSFET 124 and generate heat, which may damage the first isolation MOSFET 124. Accordingly, the active protection circuit operates to turn ON the first isolation MOSFET 124 upon detection of a failure in the second power supply 114. In particular, a supply monitoring circuit 161, preferably implemented by a voltage comparator (not shown), monitors the output voltages 120, 170 of the first and second power supplies 112, 114, detects when the output voltages 120, 170 are out of specification (e.g., +3.3 volts +/− a predetermined tolerance amount), and outputs status signal(s) 163. The controller 162 receives the status signal(s) 163 and determines whether or not and when to activate the active protection circuit 160 (by placing a low voltage level on line 165 presented at the gate G of the first control switching device 156). When a failure condition in the second power supply 114 is detected, the controller 162 outputs a low voltage level on line 165, which is present at the gate G of first control switching device 156 to turn OFF the switch 156. Accordingly, line 154 connected to both the gate G of the first isolation MOSFET 124 and the gate G of the second control switching device 196 is pulled to a high voltage level via the pull-up resistor 164. The first isolation MOSFET 124 will then turn ON to allow the first power supply 112 to actively supply power to the load 110. Turning OFF the first control switching device 156 also causes the second control switching device 196 to turn ON, which will pull line 194 to a low voltage level (e.g., ground) and thereby ensure that the second isolation MOSFET 174 will remain OFF regardless of voltage difference sensed by the monitoring circuit 118. The second isolation MOSFET 174 will remain OFF until the controller 162 allows it to turn on (for example, if it detects that the second power supply 114 has come back within specification (e.g., +3.3 volts +/− tolerance).

It will be appreciated from the above description that the active protection circuit 160 actively protects the MOSFET isolation switches 124 and 174 from becoming damaged due to a failure in one of the power supplies 112, 114, and also ensures that the power supplied to the load 110 is uninterrupted.

The active protection circuit 160 provides another protection. In the event that the load 110 draws excessive current and the second power supply 114 is switched to the common load 110, and the second power supply 114 is current limited, the first power supply 112 will begin to source current through the intrinsic body diode of the first isolation MOSFET 124 such that both power supplies 112 and 114 will source current to the load 110. Since the second power supply 114 is selected as the active power supply, its isolation MOSFET 174 will be ON, and therefore the drain-to-source resistance $R_{DS}$ of the intrinsic body diode of the second isolation MOSFET 174 will be lower than the drain-to-source resistance $R_{DS}$ of the intrinsic body diode of the first isolation MOSFET 124. Accordingly, the second power supply 114 will reach current limit and go out of specification prior to the first power supply 112. When the second power supply 114 goes out of specification, the supply monitoring circuit 161 detects this condition and informs the controller 162 via the status line(s) 163. The controller 162 then turns OFF the first control switching device 156 by placing a low voltage at the gate G of the device 156, which allows line 154 to be pulled high by pull-up resistor 164 to turn ON the first isolation MOSFET 124 to allow current to flow through the MOSFET 124 itself and not through the intrinsic body diode. This will ensure that the MOSFET 124 does not get damaged due to excessive power dissipation.

It is to be understood that any number of power supplies may be connected in parallel with associated monitoring circuitry and switching control circuitry. It is also to be understood that only the power supplies that are required to be isolated from the other components of the power supply circuit 100 need to have monitoring circuits and switching control logic associated with them.

Figure 3:
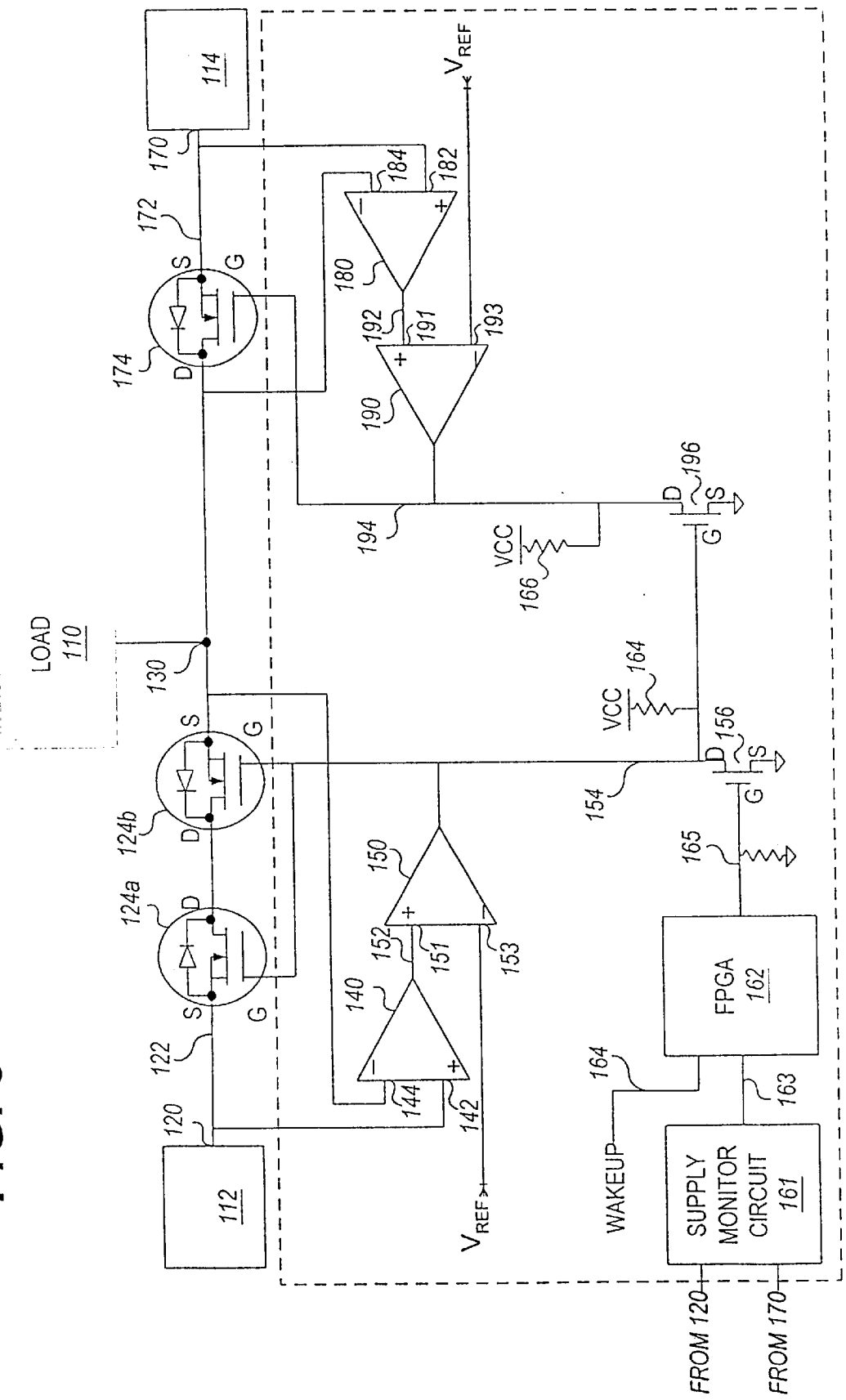
FIG. 3 is a schematic block diagram illustrating an alternative embodiment of the invention.

FIG. 3 is an alternative embodiment of the first isolation switch 124. As shown, a pair of back-to-back N-channel MOSFETs 124a, 124b replaces the first isolation MOSFET 124 of FIG. 1. As illustrated, the N-channel MOSFETs 124a and 124b are connected with their drains D tied together. The source of MOSFET 124a is electrically connected to the output 120 of the first power supply 112, and the source of MOSFET 124b is electrically connected to node 130. The gates G of both MOSFETs 124a and 124b are tied together and electrically connected to line 154. In operation, when second power supply 114 has been selected to actively supply power to the load 110, the second isolation MOSFET 174 is ON and line 154 is at a low voltage to turn off both MOSFETs 124a and 124b in order to isolate the first power supply 112 from the load 110. If a failure occurs in the load 110, current cannot through MOSFET 124a because of the reverse bias on the intrinsic diode of MOSFET 124b. Meanwhile, as described above, switching isolation MOSFET 174 will remain on until the controller 162 detects that the second power supply 114 has gone out of specification, and subsequently turns OFF the second isolation MOSFET 174 and simultaneously turns ON both MOSFETs 124a and 124b, allowing current to flow from power supply 112.

It will be appreciated from the above detailed description that the present invention affords several advantages over the prior art. With the active protection control circuit of the invention, failure of the active power supply or the detection of a short within the load is immediately detected, which allows the active protection control circuit to switch the currently active power supplies. This technique protects the isolation MOSFETs and prevents the remaining good power supply from either reaching a current limit condition or causing a large voltage deviation on its output.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An active protection circuit for a MOSFET isolated switched power supply system, said system comprising a first power supply operatively connected to a node via a first isolation switch and a second power supply operatively connected to said node via a second isolation switch, said active protection circuit comprising:

a first power supply monitoring circuit which monitors a first power supply output voltage of said first power supply and generates a first output indicating whether said first power supply output voltage deviates from a first pre-selected voltage level by a first pre-selected amount; and a controller connected to control said first isolation switch and said second isolation switch, said controller connected to receive said first output from said first power supply monitoring circuit and, if said first power supply output voltage deviates from said first pre-selected voltage level by said first pre-selected amount, turn said first isolation switch to an OFF mode to prevent current from flowing therethrough and turn said second isolation switch to an ON mode to allow current to flow therethrough from said second power supply;

a first reverse current monitoring circuit which detects reverse current flowing through said first isolation switch and generates a reverse current indicator if reverse current is detected;

wherein if said reverse current is detected flowing through said first isolation switch, said first reverse current monitoring circuit turns said first isolation switch to said OFF mode and turns said second isolation switch to an ON mode; and wherein said first reverse current monitoring circuit comprises:
a first differential amplifier operatively connected between a first input and a first output of said first isolation switch to generate a first differential amplifier output representative of a voltage drop between said first input and said first output; and
a first voltage comparator operatively connected to receive said first differential amplifier output and a pre-selected voltage reference to generate a first voltage comparator output indicative of whether reverse current is flowing through said first isolation switch.

2. An active protection circuit in accordance with claim 1, comprising:

a second reverse current monitoring circuit which detects reverse current flowing through said second isolation switch and generates said reverse current indicator if reverse current is detached;

wherein if said reverse current is detected flowing through said second isolation switch, said second reverse current monitoring circuit turns said second isolation switch to said off mode and turns said first isolation switch to an ON mode; and wherein said second reverse current monitoring circuit comprises:
a second differential amplifier operatively connected between a second input and a second output of said second isolation switch to generate a second differential amplifier output representative of a voltage drop between said second input and said second output; and a second voltage comparator operatively connected to receive said second differential amplifier output and a pre-selected voltage reference to generate a second voltage comparator output indicative of whether reverse current is flowing through said second isolation switch.

* * * * *

UNITED STATES PATENT AND TRADEMARK OFFICE
CERTIFICATE OF CORRECTION

PATENT NO. : 6,600,239 B2
APPLICATION NO. : 09/814525
DATED : July 29, 2003
INVENTOR(S) : Bradley D. Winick et al.

It is certified that error appears in the above-identified patent and that said Letters Patent is hereby corrected as shown below:

Column 10,
Line 54, delete "detached" and insert -- detected --.
Line 58, delete "off" and insert -- OFF --.

Signed and Sealed this

Twenty-seventh Day of June, 2006

JON W. DUDAS
*Director of the United States Patent and Trademark Office*